(12) United States Patent
Yano (10) Patent No.: US 9,627,094 B2
(45) Date of Patent: Apr. 18, 2017

(54) SEMICONDUCTOR MEMORY DEVICE, METHOD FOR REPAIRING BAD COLUMN AND SETTING METHOD FOR SETTING REDUNDANT INFORMATION THEREOF

(71) Applicant: Winbond Electronics Corp., Taichung (TW)

(72) Inventor: Masaru Yano, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/202,578

(22) Filed: Jul. 6, 2016

(65) Prior Publication Data

US 2017/0011809 A1    Jan. 12, 2017

(30) Foreign Application Priority Data

Jul. 8, 2015    (JP) .................................. 2015-136735

(51) Int. Cl.
| | | |
|---|---|---|
| *G11C 11/34* | (2006.01) | |
| *G11C 29/00* | (2006.01) | |
| *G11C 16/34* | (2006.01) | |
| *G11C 16/08* | (2006.01) | |

(52) U.S. Cl.
CPC .............. *G11C 29/76* (2013.01); *G11C 16/08* (2013.01); *G11C 16/3404* (2013.01); *G11C 16/3459* (2013.01)

(58) Field of Classification Search
CPC ..... G11C 19/24; G11C 29/838; G11C 29/883; G11C 29/886
USPC ............................... 365/185.09, 200, 189.16
See application file for complete search history.

(56) References Cited

U.S. PATENT DOCUMENTS

| | | | |
|---|---|---|---|
| 6,104,648 A | * | 8/2000 | Ooishi ................. G11C 7/1006 365/200 |
| 6,122,194 A | | 9/2000 | Chung et al. |
| 2003/0123301 A1 | * | 7/2003 | Jang ..................... G11C 29/785 365/200 |
| 2013/0336060 A1 | | 12/2013 | Arakawa |

FOREIGN PATENT DOCUMENTS

| | | |
|---|---|---|
| JP | 2000311496 | 11/2000 |
| JP | 2002288993 | 10/2002 |

OTHER PUBLICATIONS

"Search report of Europe Counterpart Application", issued on Nov. 16, 2016, p. 1-p. 8.

* cited by examiner

*Primary Examiner* — Han Yang
(74) *Attorney, Agent, or Firm* — Jianq Chyun IP Office (57) ABSTRACT

A method for repairing of the invention includes steps as follows: storing redundant information including an address of the bad column, identification information for identifying a failure in which one of an even column or an odd column of the bad column and an address of a redundant column of a redundant memory region for repairing the bad column; determining whether a column address of a selected column is consistent with the address of the bad column based on the redundant information; when consistent, converting a column of the bad column having the failure into a column of the redundant column based on the identification information; and not converting another column of the bad column without the failure into another column of the redundant column.

11 Claims, 7 Drawing Sheets

| redundant information | | |
|---|---|---|
| bad column address | flag | redundant column address |
| Col_1 | H | Red_0 |
| Col_2 | L | Red_1 |
| Col_10 | H | Red_2 |
| . . . | . . . | . . . |
| Col_m | H | Red_q |

<Flag bit = Low, Address for repaired = 0110011>

| column address pointer | Red. consistent (even page) | Backend column address | Red. consistent (odd page) | Backend column address |
|---|---|---|---|---|
| 0 1 1 0 0 0 1 | No | 0 1 1 0 0 0 1 | No | 0 1 1 0 0 0 1 |
| 0 1 1 0 0 1 0 | No | 0 1 1 0 0 1 0 | No | 0 1 1 0 0 1 0 |
| 0 1 1 0 0 1 1 | Yes | R R R R R R R | Yes | R R R R R R R |
| 0 1 1 0 1 0 0 | No | 0 1 1 0 1 0 0 | No | 0 1 1 0 1 0 0 |
| 0 1 1 0 1 0 1 | No | 0 1 1 0 1 0 1 | No | 0 1 1 0 1 0 1 |
| 0 1 1 0 1 1 0 | No | 0 1 1 0 1 1 0 | No | 0 1 1 0 1 1 0 |

<Flag bit = High, Address for repaired = 0110011>

| column address pointer | Red. consistent (even page) | Backend column address | Red. consistent (odd page) | Backend column address |
|---|---|---|---|---|
| 0 1 1 0 0 0 1 | No | 0 1 1 0 0 0 1 | No | 0 1 1 0 0 0 1 |
| 0 1 1 0 0 1 0 | No | 0 1 1 0 0 1 0 | No | 0 1 1 0 0 1 0 |
| 0 1 1 0 0 1 1 | Yes | R R R R R R R | Yes | R R R R R R R |
| 0 1 1 0 1 0 0 | No | 0 1 1 0 1 0 0 | No | 0 1 1 0 1 0 0 |
| 0 1 1 0 1 0 1 | No | 0 1 1 0 1 0 1 | No | 0 1 1 0 1 0 1 |
| 0 1 1 0 1 1 0 | No | 0 1 1 0 1 1 0 | No | 0 1 1 0 1 1 0 |

FIG. 8(A)　　　　FIG. 8(B)

FIG. 9

SEMICONDUCTOR MEMORY DEVICE, METHOD FOR REPAIRING BAD COLUMN AND SETTING METHOD FOR SETTING REDUNDANT INFORMATION THEREOF

CROSS-REFERENCE TO RELATED APPLICATION

This application claims the priority benefit of Japan application serial no. 2015-136735, filed on Jul. 8, 2015. The entirety of the above-mentioned patent application is hereby incorporated by reference herein and made a part of this specification.

BACKGROUND OF THE INVENTION

1. Field of the Invention

The invention relates to a semiconductor memory device, and particularly relates to a semiconductor memory device repairing a bad column by using a redundant memory.

2. Description of Related Art

For semiconductor memories such as flash memory, dynamic random access memory (DRAM), etc., it is a challenge to manufacture a memory element without a failure or a defect due to the continuous increase of the degree of integration. Thus, a redundancy scheme exists to repair apparent physical defect of a memory element occurring during a manufacturing process. For example, a redundancy scheme may include an address conversion circuit and a redundant memory region. Wherein the address conversion circuit converts an address of the memory element having the physical defect to an address of a memory element in the redundant memory region. Accordingly, the redundant memory region serves to repair the defective memory element. The address information of the defective memory and the memory element in the redundant memory region is stored in a fuse read only memory (ROM) or a register during a test for the memory chip or when the memory chip is shipped. In addition, when the address of the defective memory element is input and the address is detected, accessing of the defective memory element is forbidden. Instead, the memory element in the redundant memory region is accessed. Thus, superficially, the defective memory element does not seem to exist. By adopting such redundancy scheme (e.g., Japan Patent Publication No. 2000-311496 and Japan Patent Publication No. 2002-288993), even though some memory elements are defective, the memory may still be considered as a non-defective product. The yield rate is thus increased, and the cost of the memory is reduced.

An NAND type flash memory has a memory array. The memory array has NAND strings each including a plurality of memory cells that are serially connected. In addition, one page of data are read from or programmed (written) to the memory array as a unit through a page buffer/sense circuit. Besides, during reading and programming operations with page as a unit, to suppress interference between adjacent bit lines as much as possible, a method of dividing a page into an odd page and an even page is adopted. In the flash memory, when a column of the memory array has a failure (e.g., a short circuit or an open circuit), the even column and the odd column of the column including the failure are set as a set of bad columns, and the set of bad columns are repaired by using a set of redundant columns in the redundant memory region.

Figure 1A:
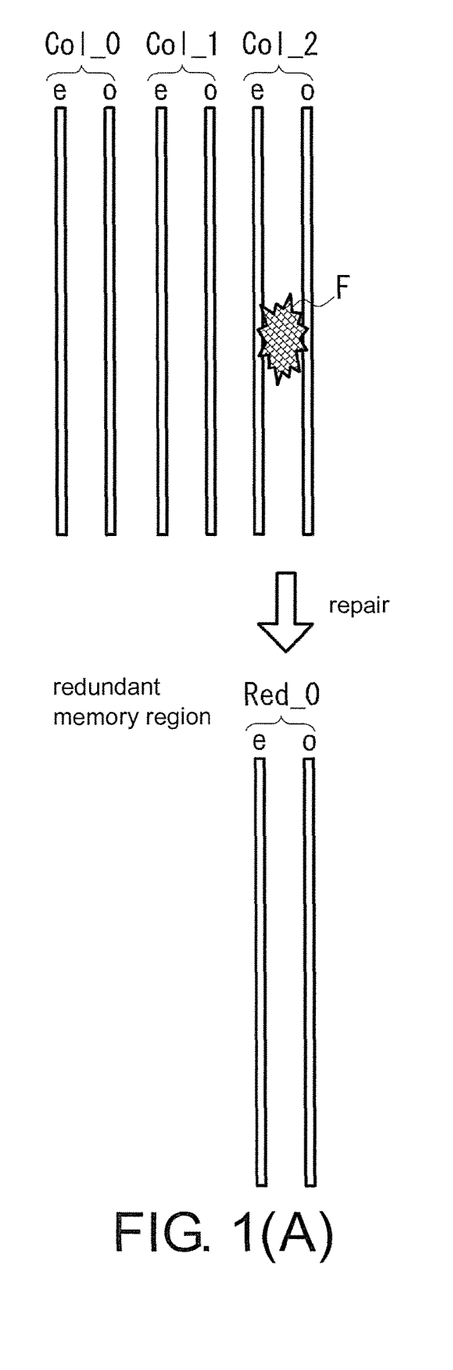
FIGS. 1(A) and 1(B) are schematic views illustrating a conventional method for repairing a bad column of a flash memory.
Figure 1B:
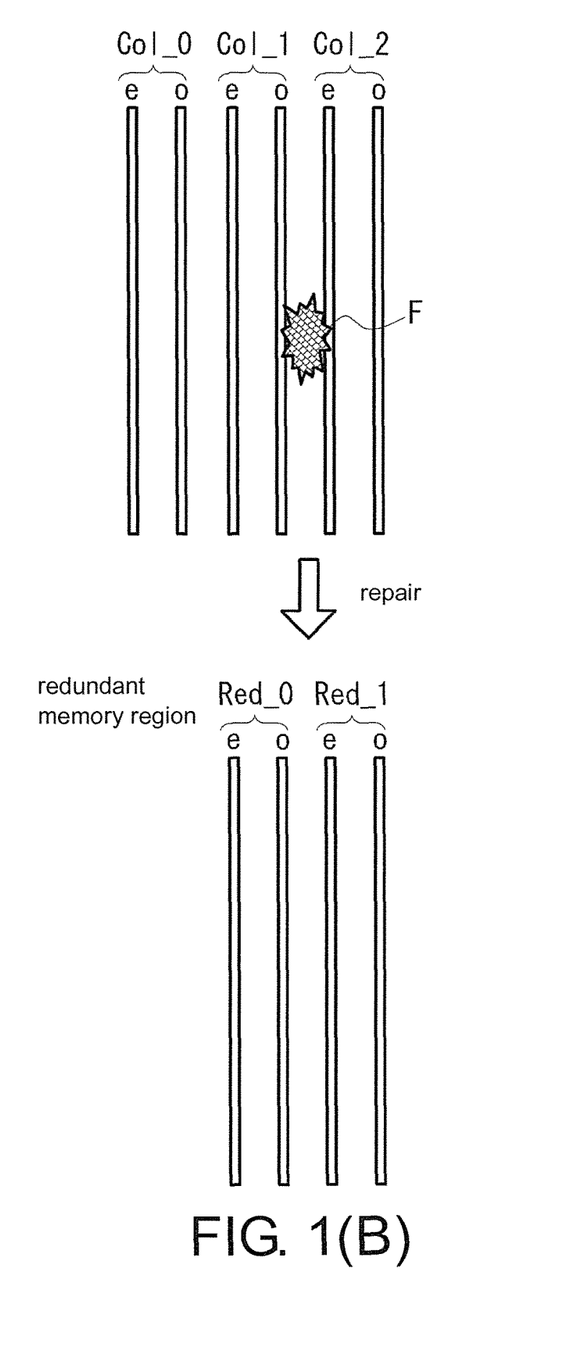

FIGS. 1(A) and 1(B) are views illustrating a conventional method for repairing a bad column of a flash memory. As shown in FIG. 1(A), the memory array has a column address Col_0 having an even column e and an odd column o, a column address Col_1 having an even column e and an odd column o, and a column address Col_2 having an even column e and an odd column o. When there is a failure F (e.g., short circuit) between the even column e and the odd column o in the column address Col_2, a set of an even column e and an odd column o in a redundant column address Red_0 in the redundant memory region is used to repair the set of the even column e and the odd column o of the column address Col_2 containing failure.

Alternatively, as shown in FIG. 1(B), when the failure F crosses the odd column o of the column address Col_1 and the even column e of the column address Col_2, the set of the even column e and the odd column o in the column address Col_1 containing failure and the set of the even column e and the odd column o in the column address Col_2 containing failure, are repaired by using a set of the even column e and the odd column o in the redundant column address Red_0 and a set of an even column e and an odd column o in a redundant column address Red_1.

However, in the two sets of bad columns shown in FIG. 1(B), the even column e in the column address Col_1 and the odd column o in the column address Col_2 are actually not defective and do not need to be repaired. Since the even column e in the column address Col_1 and the odd column o in the column address Col_2 that are not defective are also repaired, there is a waste in the repairing process of the redundant memory region, so the repair efficiency is lowered, and more redundant memory is consequently needed, thereby making the cost of the flash memory increase.

SUMMARY OF THE INVENTION

The invention provides a semiconductor memory device can improve an efficiency of adopting a redundant memory to repair bad columns.

An embodiment of the invention provides a semiconductor memory device. The semiconductor memory device includes a memory array, a redundant information memory section, and a column selection control circuit. The memory array has a memory region including a plurality of memory cells and a redundant memory region including a plurality of memory cells. A column address of each column in the memory array corresponds to a set of an even column and an odd column. The redundant information memory section stores redundant information, wherein the redundant information includes an address of a bad column, identification information for identifying a failure in which one of the even column or the odd column of the bad column, and an address of a redundant column of the redundant memory region for repairing the bad column. The column selection control circuit selects a column of the memory array according to the column address. The column selection control circuit determines whether the column address is consistent with the address of the bad column based on the redundant information. When the column address and the address of the bad column are consistent, a column of the bad column having the failure is converted into a column of the redundant column based on the identification information, and another column of the bad column without the failure is not converted into another column of the redundant column.

According to an embodiment of the invention, the column of the bad column having the failure is an odd column, while the another column of the bad column without the failure is an even column. According to an embodiment of the invention, the column of the bad column having the failure is an even column, while the another column of the bad column without the failure is an odd column. According to an embodiment of the invention, during a period that the column selection control circuit selects an odd page or an even page, the column selection control circuit determines whether a failure exists in the even column or the odd column based on the identification information. According to an embodiment of the invention, the semiconductor memory device further includes a page buffer, the page buffer keeps data read from the selected page of the memory array or keeps data programmed to the selected page, and the column selection control circuit selects data kept in the odd page or the even page in the page buffer.

According to an embodiment of the invention, the redundant information includes addresses of a first bad column and a second bad column, when two column addresses of two adjacent columns are consistent with the addresses of the first bad column and the second bad column, one of the even column and the odd column of the first bad column having the failure is converted into the column of the redundant column based on the identification information, and the other one of the even column and the odd column of the first bad column without the failure is not converted into the another column of the redundant column, while one of the even column and the odd column of the second bad column not only having the failure but also adjacent to the column of the first bad column having the failure is converted into the another column of the redundant column.

An embodiment of the invention provides a method for repairing a bad column of a semiconductor memory device including a memory array and a redundant information memory section. The memory array has a memory region including a plurality of memory cells and a redundant memory region including a plurality of memory cells. The method for repairing a bad column includes steps as follows: storing redundant information in the redundant information memory section, the redundant information comprises an address of a bad column including an even column and an odd column set as a set, an address of a redundant column in the redundant memory region for repairing the bad column, and identification information identifying a failure in which one of the even column or the odd column of the bad column; and selecting a column of the memory array. The step of selecting includes steps as follows: determining whether a column address of the column is consistent with the address of the bad column based on the redundant information; converting a column of the bad column having the failure into a column of the redundant column based on the identification information when the column address and the address of the bad column are consistent, and not converting another column of the bad column without the failure into another column of the redundant column. According to an embodiment of the invention, the step of selecting includes determining whether a failure exists in the even column or the odd column based on the identification information during a period of selecting an odd page or an even page.

An embodiment of the invention provides a setting method for setting redundant information of a semiconductor memory device having a memory array. The memory array includes a memory region having a plurality of memory cells and a redundant memory region having a plurality of memory cells. The setting method includes steps as follows: detecting an address of a bad column; identifying a failure in one of an even column and an odd column of the bad column, and generating identification information according to a type or a combination of the failure; and setting the identification information and an address of a redundant column used to convert the detected bad column into a redundant column of the redundant memory region in the semiconductor memory device. According to an embodiment of the invention, the combination of the failure identifies a failure crossing the even column of a first bad column and the odd column of a second bad column or a failure crossing the odd column of a first bad column and the even column of a second bad column.

Based on the invention, the identification information identifying which one of the even column or the odd column of the bad column has a failure is stored as the redundant information, and the bad column is repaired by using the redundant column based on the identification information. Thus, unnecessary repair to the even column or the odd column that does not have a failure may be eliminated, so as to improve a repair efficiency of the redundant memory.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following, the embodiments of the invention will be described in detail with reference to the accompanying drawings. The invention may be applied in non-volatile memory in various types of memory structures. An NAND type flash memory is described herein as an exemplary embodiment.

Figure 2:
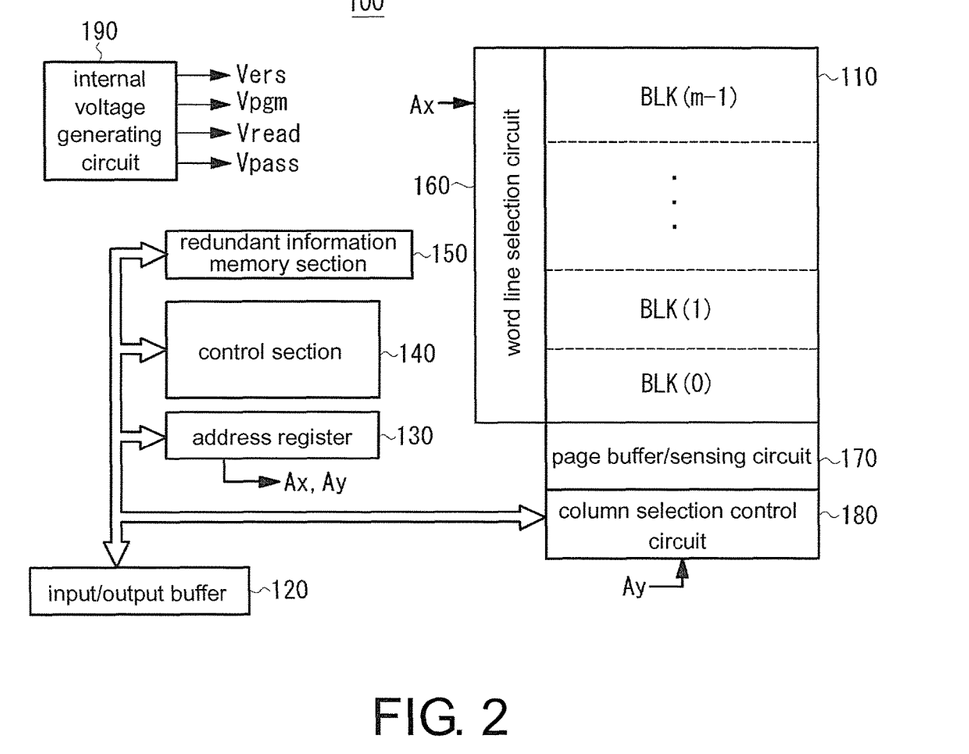
FIG. 2 is a block view illustrating a configuration of a flash memory according to an embodiment of the invention.

FIG. 2 is a view illustrating a configuration of an NAND type flash memory according to an embodiment of the invention. A flash memory 100 of this embodiment includes a memory array 110 comprising a plurality of memory cells arranged in a matrix, an input/output buffer 120 connected to an external input/output terminal I/O and keeping inputting and outputting data, an address register 130 receiving address data from the input/output buffer 120, a control section 140 receiving command data from the input/output buffer 120 or receiving an external signal to control respective parts of the flash memory 100, a redundant information memory section 150 storing redundant information relating to a bad column of the memory array 110 or a redundant column of the memory array 110 for repairing the bad column, a word line selection circuit 160 receiving row address information Ax from the address register 130 and selecting a block and a word line based on a decoding result of the row address information Ax, a page buffer/sensing circuit 170 keeping data read from a page selected by the word line selection circuit 160 or keeping data written to the selected page, a column selection control circuit 180 receiving column address information Ay from the address register 130 and selecting data of the page buffer/sensing circuit 170 based on a decoding result of the column address information Ay, and an internal voltage generating circuit 190 generating various voltages (e.g., a programming voltage Vpgm, a pass voltage Vpass, a read voltage Vread, and an erase voltage Vers) required for data reading, programming, and erasing.

Figure 3:
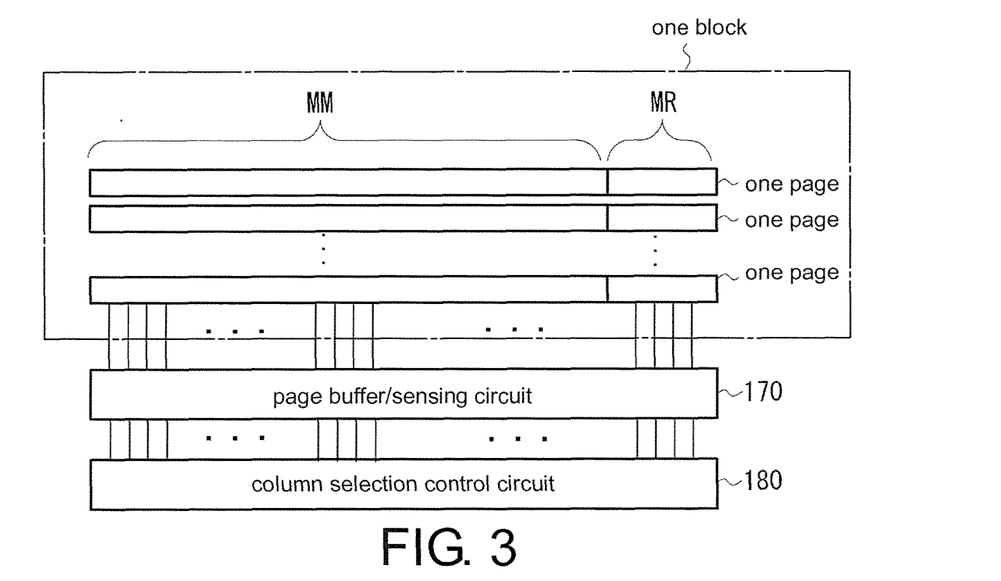
FIG. 3 is a view illustrating a configuration of a memory block.

The memory array 110 includes m memory blocks, i.e., memory block BLK(0), memory block BLK(1) . . . memory block BLK(m-1) arranged along a column direction. FIG. 3 is a view illustrating a configuration of a memory block. The memory array 110 includes a memory region MM where memory cells for regular data reading and writing are configured and a redundant memory area MR where redundant memory cells for repairing a bad column in the memory region MM are configured. One memory block includes a plurality of pages, and the memory cells of the memory region MM and the memory cells of the redundant memory region MR are included in a page.

Figure 4:
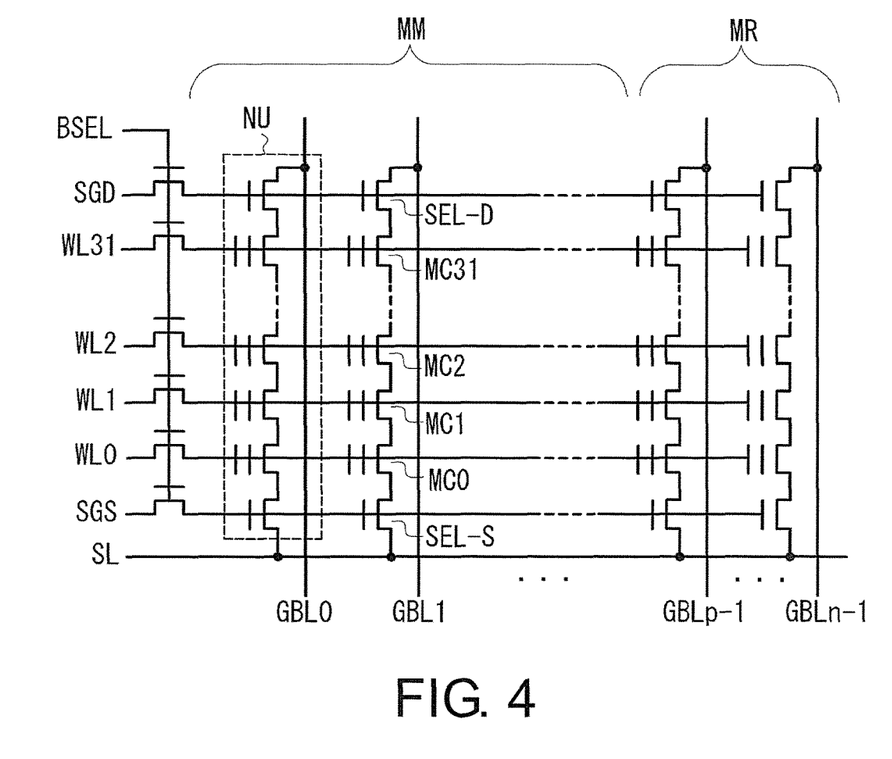
FIG. 4 is a view illustrating a configuration of NAND strings.

FIG. 4 illustrates an example of NAND strings formed in a memory block. A memory block is formed by arranging a plurality of NAND strings NU in a row direction, and the NAND strings NU includes a plurality of memory cells serially connected. In the example shown in FIG. 4, one memory block includes n columns (bits) of the NAND strings NU, and a portion of the NAND strings NU are assigned to the redundant memory region MR. For example, one page includes 2 K bytes, and 64 bytes of the 2 K bytes are assigned to the redundant memory region MR. Bit lines GBL0, GBL2, GBL4 . . . GBLn-2 in even numbers form even pages, and bit lines GBL1, GBL3, GBL5 . . . GBLn-1 in odd numbers form add pages.

One NAND string NU includes 32 serially connected memory cells MC0~MC31, a source side selection transistor SEL_S, and a drain side selection transistor SEL_D, for example. Gates of the memory cells MC0~MC31 are respectively connected to corresponding word line WL0 to word line WL31, gates of the source side selection transistor SEL_S and the drain side selection transistor SEL_D are respectively connected to a source side selection line SGS and a drain side selection line SGD. In addition, the source side selection transistor SEL_S is connected to a common source line SL, and a drain side selection transistor SEL_D is connected to a corresponding bit line GBL (GBL0~GBLn-1).

The word line WL0 to the word line WL31, the source side selection line SGS and the drain side selection line SGD are connected to the word line selection circuit 160 through commonly input to a gate of a block selection transistor from a block selection line BSEL. The word line selection circuit 160 selects a block through the block selection line BSEL according to the row address information Ax. And based on an operation state, the word line selection circuit 160 suitably drives the source side selection line SGS, the drain side selection line SGD, and the word line WL0 to the word line WL31 of the selected block.

The memory unit MC0~MC31 includes a metal oxide semiconductor (MOS) type transistor, for example. The MOS type transistor includes a tunnel oxidation film formed on a channel, a floating gate (charge accumulating layer) that accumulates charges formed on the tunnel oxidation film, and a control gate formed on the floating gate with intervention of a dielectric film. Normally, when the charges do not accumulate in the floating gate, namely when a data "1" is written, a threshold value is in a negative state, and the memory unit is "normally on". When electrons accumulate in the floating gate, namely a data "0" is written, the threshold is converted to a positive state, and the memory unit MC0~MC31 is "normally off". The memory unit MC0~MC31 may be a unit that stores binary data or a unit that stores multilevel data.

The bit line GBL0, the bit line GBL1, . . . ,the bit line GBLn-1 connected to respective the NAND strings NU are connected to the page buffer/sense circuit 170 through a bit line selection circuit not shown herein. In an exemplary embodiment, the bit line selection circuit may select an even page by an even bit line or an odd page by an odd bit line in reading or programming, and connecting the selected even bit line or odd bit line to the page buffer/sense circuit 170. For example, when a page is being read, the odd page of the page can be firstly grounded to a reference potential such as GND, and a potential or a current of the bit line of the even page is sensed by the sense circuit. Then, the even page is grounded to the reference potential such as GND, and a potential or a current of the bit line of the odd page is sensed by the sense circuit. Thus, through reading or programming by proceeding separately with the even and odd pages, one sense circuit is shared by a pair of an even bit line and an odd bit line. If each of the even page and the odd page forms a page, the page buffer/sense circuit 170 includes a sense circuit for one page and the page buffer keeps data of two pages. For example, assuming that one page in the memory array 110 has 2 K bytes, in a reading operation, a half of data, namely 1 K bytes of the even bit, are sensed and kept by the sense circuit, and then the other half the data, namely 1 Kbytes of the odd bit, are sensed and kept by the sense circuit.

Besides, in another embodiment, the page buffer/sense circuit 170 may include a high-speed cache register that keeps the same data as that of the page buffer. The high-speed cache register is connected to the page buffer through a transmission gate. During a period when the page buffer is connected to the page selected by the memory array, data are input and output through the high-speed cache buffer.

The redundant information memory section 150 stores address information of a bad column (bad bit line) in the memory region MM or address information of a redundant column that repairs the bad column. A bad column is a physical defect in the product to be shipped. The bad column includes, for example, a defect such as a short circuit between adjacent columns, an open circuit in a column, or a defect of a memory unit. The redundant information includes an address of the bad column, a flag bit for identifying which of the even column or the odd column of the bad column has a failure, and an address of the redundant column for repairing the bad column. The redundant information is stored in a fuse ROM or other non-volatile media when the product is shipped, for example.

Figure 5:
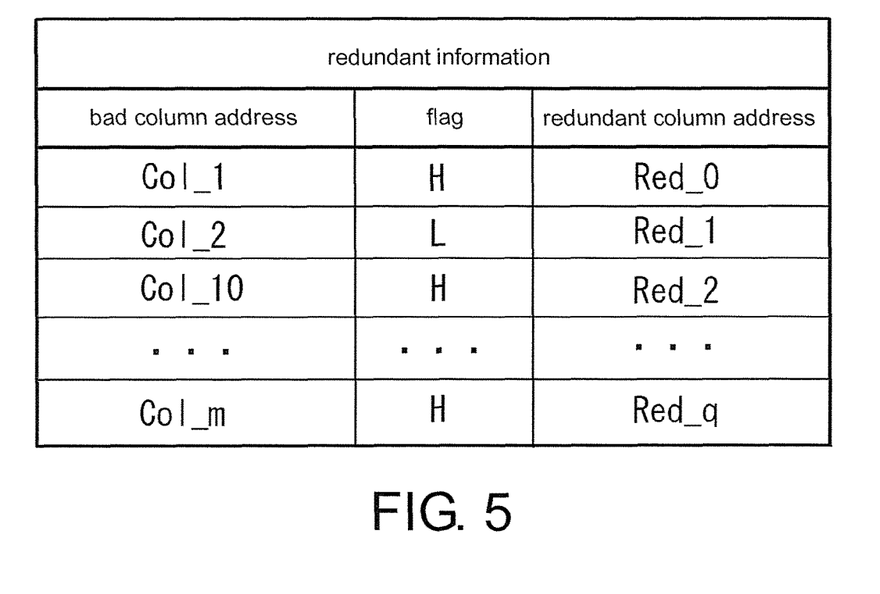
FIG. 5 is a view illustrating redundant information of a redundant information memory section.

FIG. 5 is an example of the redundant information stored by the redundant information memory section 150. In this embodiment, one bad column including a set of an even column and an odd column is repaired by a redundant column including a set of an even column and an odd column in the redundant memory region MR. That is, the address of a corresponding bad column corresponds to a set of the even column and the odd column, and the flag bit identifies which of the even column and the odd column of the bad column has a failure. Here, a flag bit "L" in a low logical level indicates that at least the even column has a failure, and a flag bit "H" in a high logical level indicates that only the odd column has a failure. In other words, when the initial bit line of the memory array starts from an even bit, the flag bit "L" indicates that the failure of the bad column starts from the even column, and the flag bit "H" indicates that the failure of the bad column starts from the odd bit. In the example of FIG. 5, a column address Col_1 has the flag bit "H", so the failure of the column address Col_1 is at the odd column, and a column address Col_2 has the flag bit "L", so the failure of the column address Col_2 includes the even column. The failures of the column address Col_1 and the column address Col_2 demonstrate the situation of the bad columns of FIG. 1(B).

The column selection control circuit 180 selects the bit line GBL0~GBLn-1 based on the column address information Ay, so as to write data to or read data from the selected bit line. In addition, when the column address information Ay is consistent with the address of the bad column, the column selection control circuit 180 converts the column address information Ay into the address of the redundant column based on the redundant information stored in the redundant information memory section 150.

The column selection control circuit 180 determines whether an input column address is consistent with the address of the bad column when a random read or programming operation is performed based on a column address input externally. If consistent, an address pointer is moved to the column address of the redundant address. Besides, when a sequential reading or programming operation is performed, the column selection control circuit 180 determines whether any of column addresses that have increments from a starting column address is consistent with the address of the bad column. If consistent, the address pointer is moved to the column address of the redundant column. Here, it should be noted that conversion of the column address differs according to a value of the flag bit that indicates a property of the bad column. In other words, when the flag bit is "L", the bad column has a failure that starts from the even column, as shown in FIG. 1(A), and a set of the even column and the odd column of the redundant column serves to repair a bad column including a set of even column and the odd column. Alternatively, when the flag bit is "H", as shown in FIG. 1(B), the bad column has a failure that starts from the odd column. Thus, the even column of the bad column without a failure is not replaced by the redundant column. Instead, the repair of the bad column is performed by replacing the odd column of the bad column having a failure with the odd column of the redundant column.

Figure 6:
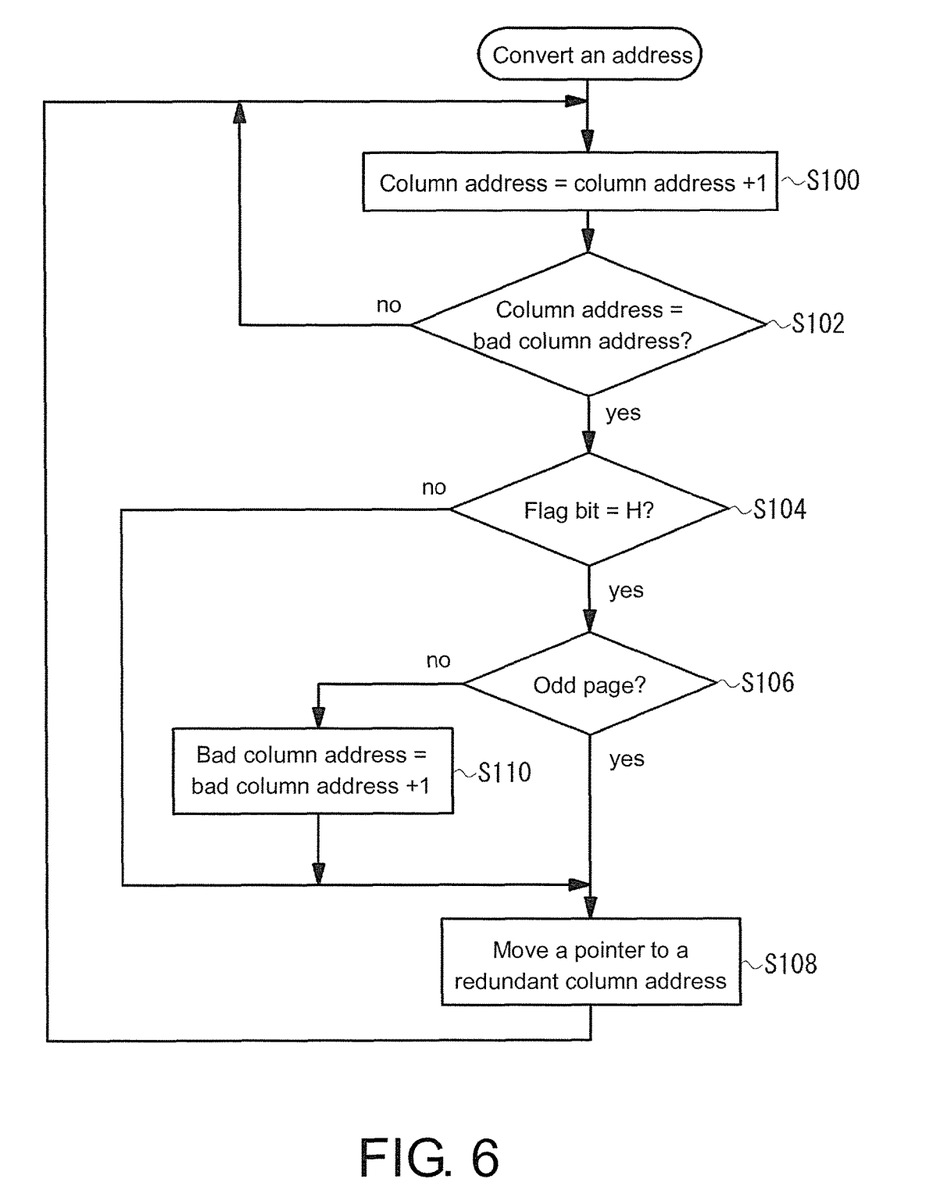
FIG. 6 is a flowchart illustrating a method for repairing a bad column of a flash memory according to an embodiment of the invention.

In the following, details concerning a method for repairing a bad column of a flash memory according to this embodiment are described with reference to a flow shown in FIG. 6. When an external controller inputs a read command, address information, and an external control signal into the flash memory, the control section 140 controls operations of respective parts of the flash memory based on the read command. Here, as an example of a read operation, the data kept by the page buffer/sense circuit 170 are continuously read. Thus, the column selection control circuit 180 makes the address of the starting column provided by the address register 130 increment, while reads the data kept in the page buffer/sense circuit 170 at the same time. The increment of the column address may be achieved by moving the address pointer by using software or using an address counter.

The column selection control circuit 180 can make the column address increment by one by adopting the aforementioned ways (S100), and then determining whether the column address meets the address of the bad column based on the redundant information shown in FIG. 5(S102). The address of the bad column is an address of a column to be repaired or fixed by using the redundant column. When the column address and the address of the bad column are inconsistent, an increment of one of the column address is performed by Step S100. When the column address and the address of the bad column are consistent, the column selection control circuit 180 refers to the flag bit added based on the property of the bad column to determine whether the flag bit is "H" or "L" (S104).

When the flag bit is "L", namely when a failure exists in the even column of the bad column, the column selection control circuit 180 moves the address pointer to the address of the redundant column shown in the redundant information (S108), so as to read the data kept in the redundant column. In other words, the bad column including the even column and the odd column is directly repaired by the redundant column including the even column and the odd column, so as to move the address pointer by reading a column of the redundant column when reading the even page and reading another column of the redundant column when reading the odd page.

Alternatively, when the flag bit is "H", namely when the failure exists in the odd column of the bad column (S104), the column selection control circuit 180 further determines whether to perform the read operation of the odd page of the bad column (S106). In the reading operation of the even page of the bad column without the failure, an increment of one of the address of the bad column is performed (S110), and a column of the redundant columns is used to repair the increment address corresponding to the odd column of the bad column having the failure, while in the reading operation of the odd page, an increment of one of the address of the bad column is not performed. Instead, the movement of the address pointer is controlled by using another column of the redundant column for repairing.

In addition, the repair of the bad column in this embodiment is similarly performed in other random read operations or random or sequential programming operations.

Figure 7:
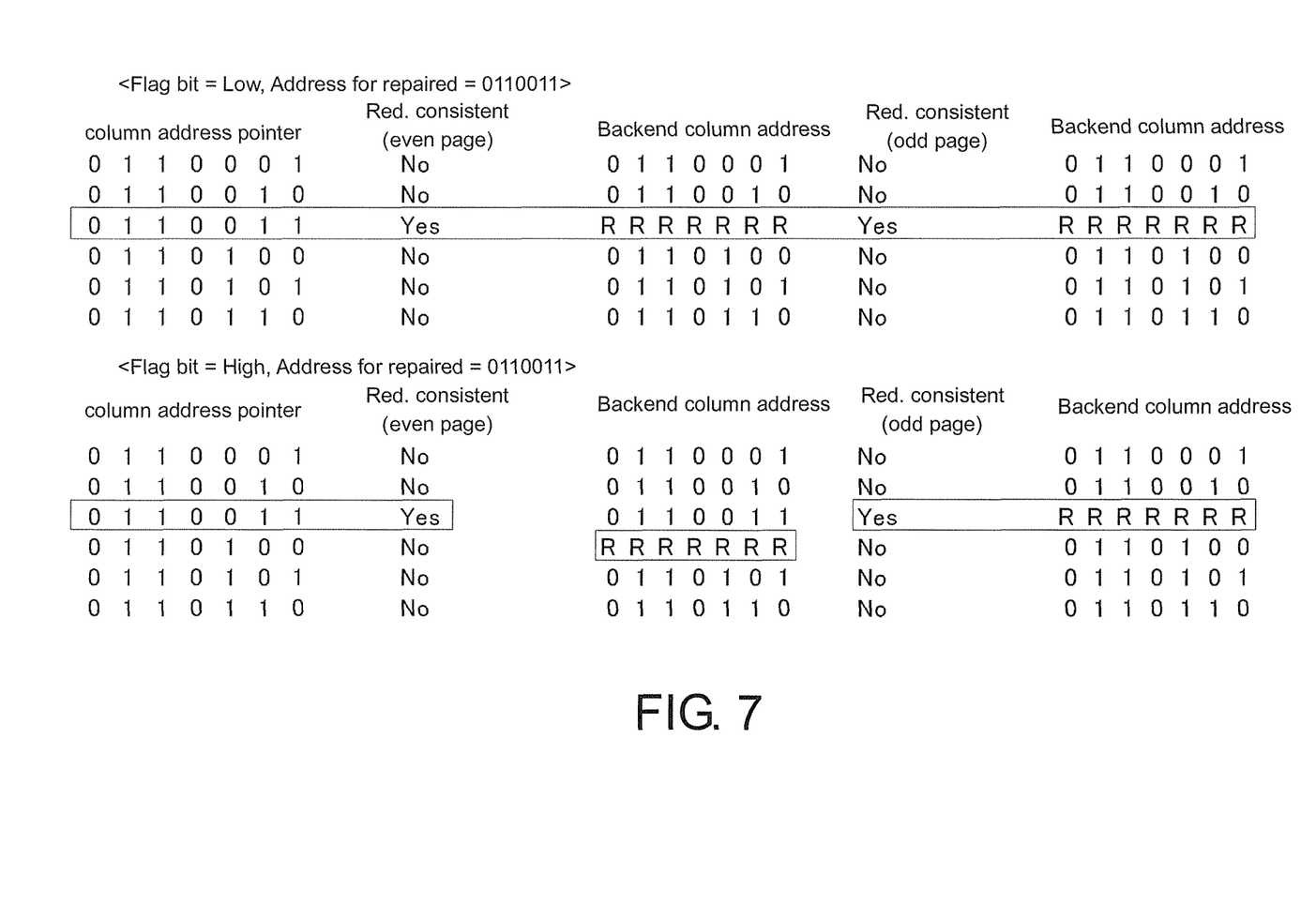
FIG. 7 is a view illustrating a specific example of a method for repairing a bad column according to the embodiment.

FIG. 7 illustrates an example of repairing a bad column. Here, the address of the bad column is set as "0110011". An upper segment of FIG. 7 indicates the conversion of the column address when the flag bit is "L" (which indicates the even column of the bad column has a failure), and a lower segment of FIG. 7 indicates the conversion of the column address when the flag bit is "H" (which indicates the odd column of the bad column has a failure).

Under the circumstance that the flag bit indicated in the upper segment is "L", increments of the column address are performed until the column address is "0110011". When the incremental column address is set as "0110011", for an operation on the even page, the address of the bad column is converted to a column address of the redundant column (indicated as "R" in the figure), and for an operation on the odd page, the address of the bad column is converted to another column address of the redundant column (indicated as "R" in the figure).

Under the circumstance that the flag bit indicated in the lower segment is "H", when the column address is set to be the bad column "0110011", the address of the bad column is converted into a column address of the redundant column (indicated as "R" in the figure) for an operation on the odd page. For an operation on the even page, an increment of one of the address of the bad column is performed, and the incremental bad address is converted into another column address of the redundant column.

Figure 8A:
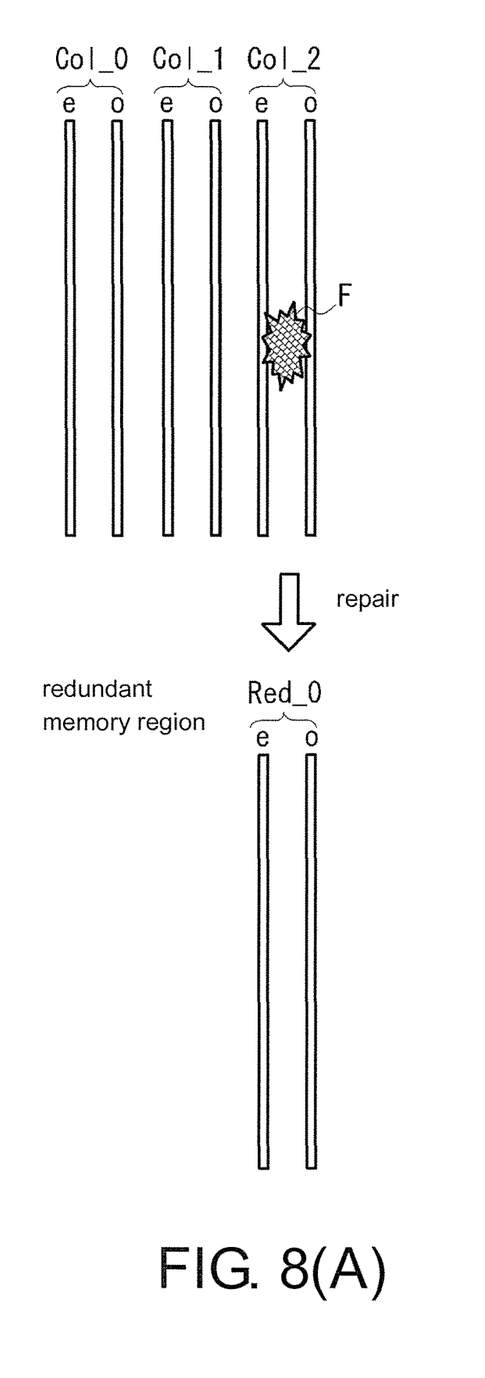
FIG. 8(A) and 8(B) are schematic views illustrating a method for repairing a bad column of a flash memory according to an embodiment of the invention.
Figure 8B:
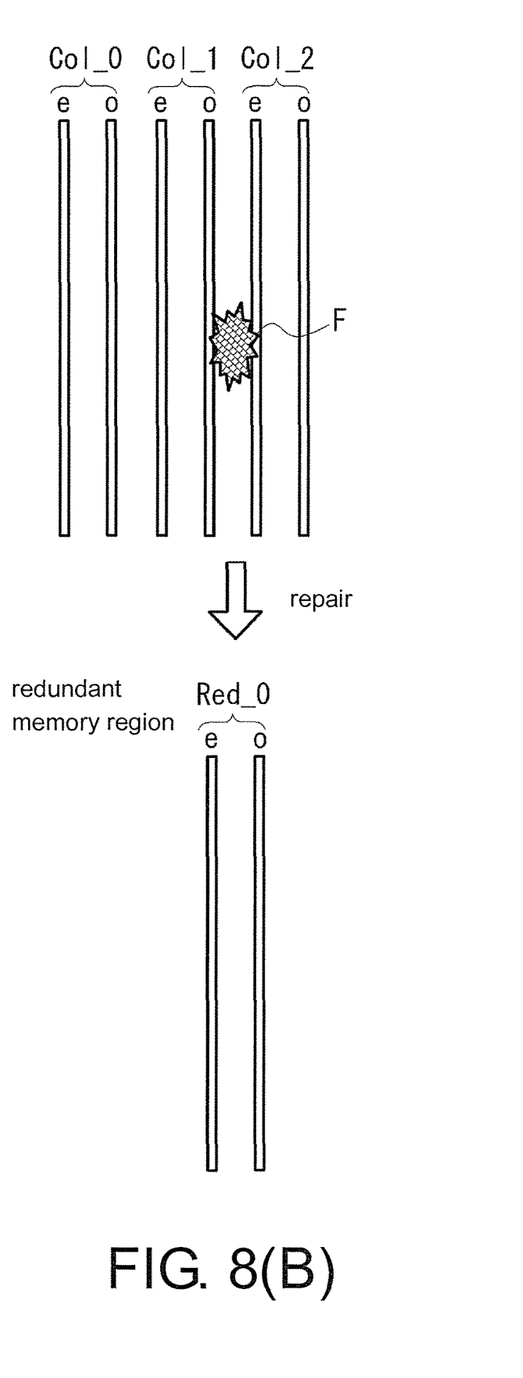

FIGS. 8(A) and 8(B) are schematic views illustrating repairing a bad column according to this embodiment. FIGS. 8(A) and 8(B) respectively correspond to FIGS. 1(A) and 1(B). As shown in FIGS. 1(A) and 8(A), when an even column e of the column address Col_2 has a failure, the flag bit is "L", and a redundant column address Red_0 corresponding to a set of an even column and an odd column is used to repair the set of odd column o and even column e of bad column address Col_2. Besides, as shown in FIG. 8(B), when an odd column o of the bad column address Col_1 and the even column e of the bad column address Col_2 have failures, the flag bit becomes "H".

Different from the previous repair process, the even column e of the bad column address Col_1 and the odd column o of the bad column address Col_2 are not repaired. Instead, redundant column address Red_0 corresponding to a set of the even column and the odd column is used to repair the odd column o of the bad column address Col_1 and the even column e of the adjacent bad column address Col_2.

In this way, in the process of repairing a bad column including a set of an even column and an odd column as a unit by using a redundant column in this embodiment, even failures crossing adjacent columns, the failures can still be repaired by using a set of an even column and an odd column of a redundant column. Thus, the repair efficiency using the redundant memory is able to be increased, and a yield rate of the product is consequently improved.

Besides, in this embodiment, an example where a page starts with the even column is described for ease of illustration. However, in an example differing thereto and starting with the odd column, the embodiment is equally applicable.

Figure 9:
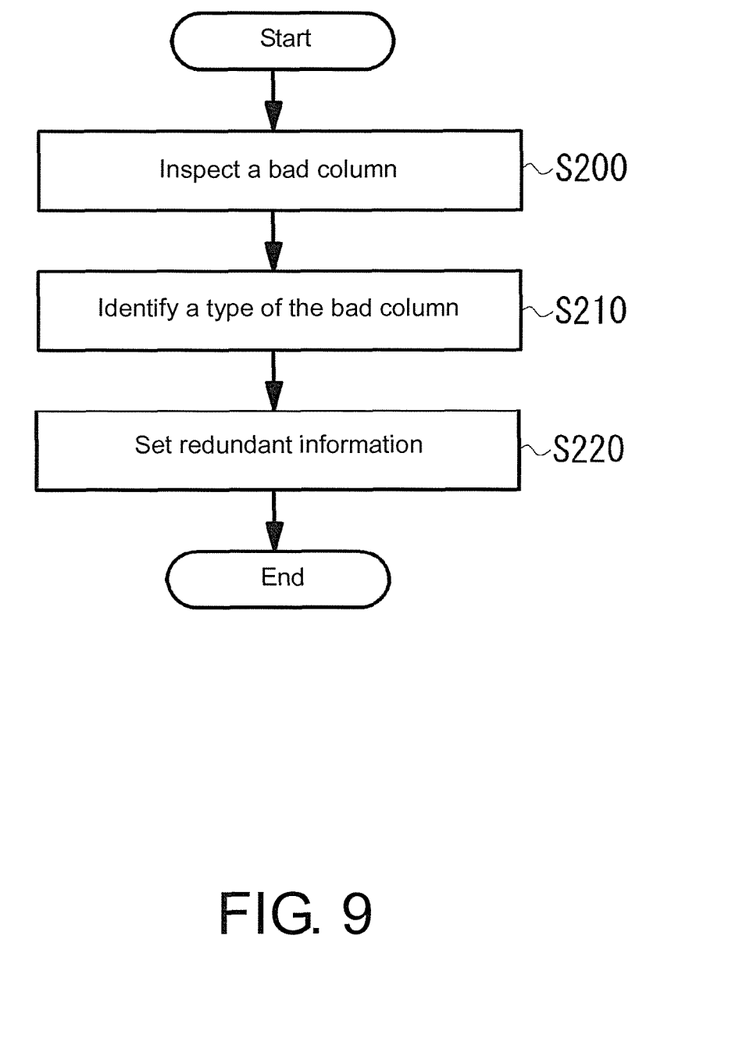
FIG. 9 is a flowchart illustrating a method for setting redundant information according to an embodiment of the invention.

In the following, details concerning a method for setting redundant information of this embodiment are described with reference to FIG. 9. Before a flash memory is shipped, a test sequence determined in advance by a bad product detecting device or an external controller is performed, so as to detect a bad column of the flash memory (S200). For example, a write operation is performed externally of the chip, and data read from the memory array are compared to the data written for comparison/verification, and a bad column is detected based on a result of verification. Alternatively, with block as a unit, an erase operation is performed based on an erase command, and the bad column is detected based on a result of erasing verification.

Then, a type of failure or combination of failures of the detected bad column is identified (S210). Which type of identification information is formed may also be determined by a form of operation of the flash memory, such as identifying whether the failure of the bad column exists in the even column or the odd column (such as the flag bit). Alternatively, an operation may be performed to identify a combination of failure from the even column to the odd column or from the odd column to the even column. Then, the redundant information as shown in FIG. 5 is set in the fuse ROM or other non-volatile memory sections in the flash memory (S220).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A semiconductor memory device, comprising:
a memory array, having a memory region comprising a plurality of memory cells and a redundant memory region comprising a plurality of memory cells, wherein a column address of each column in the memory array corresponds to a set of an even column and an odd column;
a redundant information memory section, storing redundant information, wherein the redundant information comprises an address of a bad column, identification information for identifying a failure in which one of the even column or the odd column of the bad column, and an address of a redundant column of the redundant memory region for repairing the bad column; and
a column selection control circuit, selecting a column of the memory array according to the column address,
wherein the column selection control circuit determines whether the column address is consistent with the address of the bad column based on the redundant information, when the column address and the address of the bad column are consistent, a column of the bad column is converted into a column of the redundant column based on the identification information, and another column of the bad column without the failure is not converted into another column of the redundant column.

2. The semiconductor memory device as claimed in claim 1, wherein the column of the bad column having the failure is an odd column, while the another column of the bad column without the failure is an even column.

3. The semiconductor memory device as claimed in claim 1, wherein the column of the bad column having the failure is an even column, while the another column of the bad column without the failure is an odd column.

4. The semiconductor memory device as claimed in claim 1, wherein during a period that the column selection control circuit selects an odd page or an even page, the column selection control circuit determines whether a failure exists in the even column or the odd column based on the identification information.

5. The semiconductor memory device as claimed in claim 4, wherein the semiconductor memory device further comprises a page buffer, the page buffer keeps data read from the selected page of the memory array or keeps data programmed to the selected page, and the column selection control circuit selects data kept in the odd page or the even page in the page buffer.

6. The semiconductor memory device as claimed in claim 1, wherein the redundant information includes addresses of a first bad column and a second bad column, when two column addresses of two adjacent columns are consistent with the addresses of the first bad column and the second bad column, one of the even column and the odd column of the first bad column having the failure is converted into the column of the redundant column based on the identification information, and the other one of the even column and the odd column of the first bad column without the failure is not converted into the another column of the redundant column, while one of the even column and the odd column of the second bad column not only having the failure but also adjacent to the column of the first bad column having the failure is converted into the another column of the redundant column.

7. A method for repairing a bad column of a semiconductor memory device, wherein the semiconductor memory device comprises a memory array and a redundant information memory section, the memory array has a memory region comprising a plurality of memory cells and a redundant memory region comprising a plurality of memory cells, the method for repairing the bad column comprising steps as follows:

storing redundant information in the redundant information memory section, the redundant information comprises an address of a bad column including an even column and an odd column set as a set, an address of a redundant column in the redundant memory region for repairing the bad column and identification information identifying a failure in which one of the even column or the odd column of the bad column; and selecting a column of the memory array, and determining whether a column address of the column is consistent with the address of the bad column based on the redundant information; converting a column of the bad column having the failure into a column of the redundant column based on the identification information when the column address and the address of the bad column are consistent; and not converting another column of the bad column without the failure into another column of the redundant column.

8. The method for repairing the bad column as claimed in claim 7, wherein the step of selecting comprises determining whether a failure exists in the even column or the odd column based on the identification information during a period of selecting an odd page or an even page.

9. The method for repairing the bad column as claimed in claim 7, wherein the redundant information includes addresses of a first bad column and a second bad column, and the step of the determining comprising determining whether two column addresses of two adjacent columns are consistent with the addresses of the first bad column and the second bad column, and the step of the converting comprising converting a column of a first bad column having the failure into a column of the redundant column based on the identification information; and not converting the other column of the first bad column without the failure into the another column of the redundant column, but converting a column of a second bad column not only having the failure but also adjacent to the column of the first bad column having the failure into the another column of the redundant column.

10. A setting method for setting redundant information of a semiconductor memory device, wherein the semiconductor memory device comprises a memory array, the memory array comprises a memory region having a plurality of memory cells and a redundant memory region having a plurality of memory cells, the method comprising steps as follows:

detecting an address of a bad column;

identifying a failure in one of an even column and an odd column of the bad column, and generating identification information according to a type or a combination of the failure; and setting the identification information and an address of a redundant column used to convert the detected bad column into a redundant column of the redundant memory region in the semiconductor memory device.

11. The setting method as claimed in claim 10, wherein the combination of failure identifies a failure crossing the even column of a first bad column and the odd column of a second bad column or a failure crossing the odd column of a first bad column and the even column of a second bad column.

* * * * *